| (12) | United States Patent | (10) Patent No.: | US 9,559,673 B2 |
|---|---|---|---|
| | Grubelich | (45) Date of Patent: | Jan. 31, 2017 |

(54) LOW-POWER WIDE-RANGE LEVEL SHIFTER

(71) Applicant: QUALCOMM Incorporated, San Diego, CA (US)

(72) Inventor: Bjorn Erik Grubelich, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 57 days.

(21) Appl. No.: 14/676,006

(22) Filed: Apr. 1, 2015

(65) Prior Publication Data

US 2016/0294373 A1    Oct. 6, 2016

(51) Int. Cl.
  H03L 5/00      (2006.01)
  H03K 3/356    (2006.01)
  H03K 3/012    (2006.01)

(52) U.S. Cl.
  CPC ........ H03K 3/356104 (2013.01); H03K 3/012 (2013.01); H03K 3/356017 (2013.01)

(58) Field of Classification Search
  None
  See application file for complete search history.

(56) References Cited

U.S. PATENT DOCUMENTS

| 6,043,698 | A | 3/2000 | Hill |
| 6,414,534 | B1 | 7/2002 | Wang et al. |
| 7,839,170 | B1 | 11/2010 | Yang et al. |
| 7,982,498 | B1 | 7/2011 | Chen |
| 8,203,373 | B2 | 6/2012 | Herzer et al. |
| 8,324,951 | B1 * | 12/2012 | Zarkesh-Ha ......... H03K 3/0375 327/206 |
| 2004/0227557 | A1 | 11/2004 | Ishikawa et al. |
| 2009/0206878 | A1 | 8/2009 | Fan |
| 2012/0268182 | A1 | 10/2012 | Lee |
| 2014/0152352 | A1 | 6/2014 | Wang |

OTHER PUBLICATIONS

International Search Report and Written Opinion—PCT/US2016/020286—ISA/EPO—May 17, 2016.

* cited by examiner

*Primary Examiner* — Lincoln Donovan
*Assistant Examiner* — Khareem E Almo
(74) *Attorney, Agent, or Firm* — Haynes and Boone, LLP

(57) ABSTRACT

A latch-based level-shifter is provided that includes an edge-triggered pulse generator that drives a switch to switch off and isolate a pair of cross-coupled inverters in the level-shifter from ground for a transition period responsive to rising and falling edges in an input signal.

16 Claims, 3 Drawing Sheets

LOW-POWER WIDE-RANGE LEVEL SHIFTER

TECHNICAL FIELD

This application relates to level shifters, and more particularly to a low-power wide-range level shifter.

BACKGROUND

Modern integrated circuits typically use core devices located in a low-voltage domain to save power and increase processing speed. As technology advances, the power supply voltage for the low-voltage domain continues to decrease. But these same devices use legacy input/output (I/O) standards that require higher power supply voltages. The devices in the low power domain must thus interface through level shifters to the I/O buffers using these higher-voltage legacy I/O standards.

The decreasing power supply voltage used in the low-voltage domains increases the input-to-output voltage range requirement for the corresponding level shifters. For example, it may be necessary to shift from a low-voltage-domain power supply voltage of approximately 0.7 V to an I/O power supply voltage of 1.8 V using a latch-based level shifter. Like any latch, a latch-based level shifter includes a pair of cross-coupled inverters. Each inverter is formed from a serial stack of a PMOS transistor and an NMOS transistor. At any given time, one of the PMOS transistors in the latch-based level shifter will be on. An NMOS access transistor having its gate controlled by the low-voltage domain input signal being shifted must be able to shut down this switched-on PMOS transistor.

Transistors in the low-voltage domain may use a relatively thin gate-oxide layer because of the reduced stress from the lower power supply voltage. In contrast, transistors in a high-voltage power domain such as used for I/O devices require a thicker gate-oxide layer due to the increased stress from the higher power supply voltage. The NMOS access transistors in a latch-based level-shifter are thus thick gate-oxide devices as they are exposed to the I/O power supply voltage. Although each NMOS access transistor is powered by the low-voltage domain input signal, its overdrive is relatively weak as it is driven by the low-voltage-domain power supply voltage. For example, if the NMOS access transistor has a threshold voltage of 400 millivolts, the overdrive is just 300 millivolts for a low-voltage-domain power supply voltage of 0.7 V. Given this weak overdrive, the NMOS access transistors must thus be relatively large so that they can flip the state of the latch in the latch-based level shifter. Accordingly, conventional latch-based level shifters have poor density, particularly at the increased voltage conversion ranges required for level-shifting from modern low-voltage power supply voltages to legacy I/O power supply voltages. Moreover, conventional latch-based level shifters suffer from power consumption issues due to the crowbar circuit current from the power supply node to ground that is discharged while the NMOS access transistor overcomes the inverter's switched-on PMOS transistor.

Accordingly, there is a need in the art for improved latch-based level shifters having improved density and lower power consumption.

SUMMARY

A latch-based level-shifter is provided that includes a latch core having a pair of cross-coupled inverters. The cross-coupled inverters include a virtual ground node that couples to ground through a switch. A pulse generator responds to rising and falling edges in an input signal to the level-shifter by opening the switch for a transition period. The cross-coupled inverters are thus isolated from ground during the transition period following each rising and falling edge in the input signal. This isolation is quite advantageous as compared to conventional latch-based level-shifters as a struggle between a PMOS transistor in each cross-coupled inverter and a corresponding NMOS access transistor is significantly reduced.

This conventional struggle occurs when one of the NMOS access transistors must discharge an output node for the corresponding cross-coupled inverter while the PMOS transistor in the corresponding cross-coupled inverter is still conducting and charging the output node. Since the NMOS access transistor is discharging while the PMOS transistor is charging, the resulting crowbar current wastes power in conventional latch-based level-shifters. In addition, the conventional struggle between the NMOS access transistor and the corresponding cross-coupled PMOS transistor slows switching speeds. To enable a conventional latch-based level-shifter to win the struggle within an acceptable period of time required the NMOS access transistors to be relatively large compared to the corresponding PMOS transistors in the cross-coupled inverters, which lowers density.

In contrast, the advantageous latch-based level-shifter disclosed herein may use smaller access transistors due to the substantial reduction of the NMOS/PMOS struggle discussed above. In addition, the disclosed latch-based level-shifter is lower power as crowbar currents are also substantially reduced as compared to conventional latch-based level-shifters. Moreover, the operating speeds are improved as well. These and additional advantageous features may be better appreciated with regard to the following detailed description of example embodiments.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

A latch-based level shifter is provided that level shifts an input signal from a low-voltage domain into an output signal in a high-voltage domain. To avoid the NMOS-PMOS struggles discussed above between an NMOS access transistor and a cross-coupled inverter PMOS transistor, a ground node for the level shifter couples to ground through a switch. An edge-triggered pulse generator pulses the switch off responsive to the rising and falling edges in the input signal. Since both edges trigger the pulse generator, it doesn't matter whether the input signal is transitioning from ground to the low-voltage-domain power supply voltage or is transitioning from the low-voltage-domain power supply voltage to ground: in either case, the edge-triggered pulse generator pulses the switch off. This is quite advantageous because the NMOS-PMOS struggle discussed previously is abated. These advantageous features may be better appreciated with regard to the following example embodiment.

Figure 1:
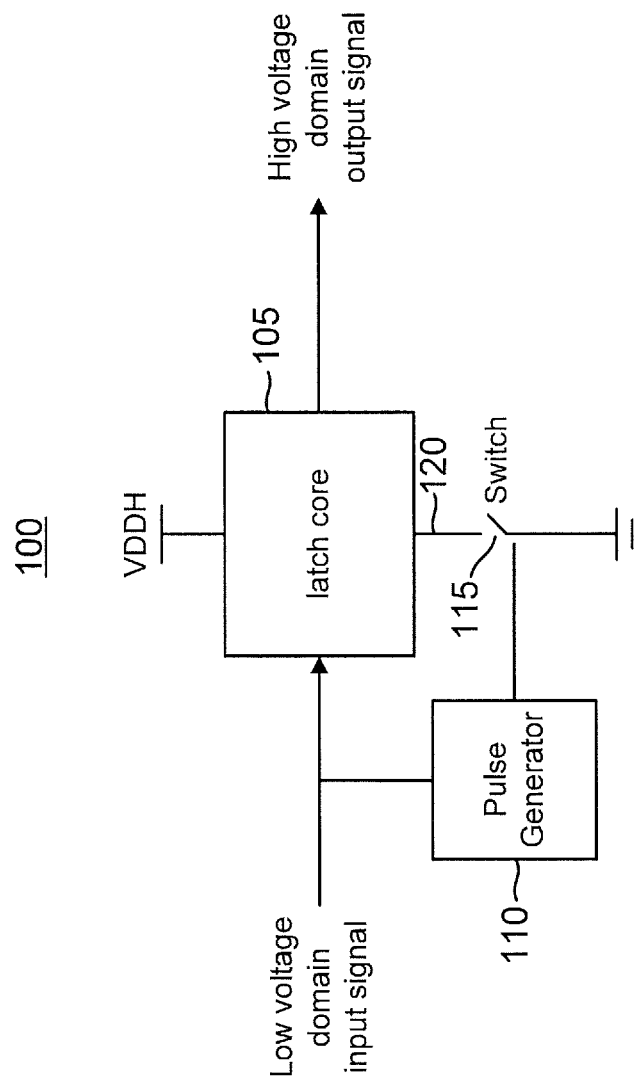
FIG. 1 is a block diagram of a latch-based level-shifter in accordance with an embodiment of the disclosure.

FIG. 1 illustrates an example latch-based level-shifter 100. A latch core 105 includes a pair of cross-coupled inverters (discussed further below with regard to FIG. 2) whose PMOS transistors are powered by a power supply node carrying the high voltage domain power supply voltage. The sources for the NMOS transistors in the cross-coupled inverters in latch core 105 form a ground node 120 that couples to ground through a switch 115. An edge-triggered pulse generator 110 pulses switch 115 to open responsive to the rising and falling edges in a low-voltage-domain input signal. For example, suppose that the input signal switches from ground to the low voltage domain power supply voltage (VDDL). In response to this transition, latch core 105 will then drive the output signal from ground to the high power supply voltage (VDDH). A PMOS transistor within a cross-coupled inverter in latch core 105 that was switched on while the output signal voltage was grounded must then be switched off so that the output signal voltage can swing to VDDH. In a conventional latch-based level-shifter, this flipping of the latch state would involve the conduction of substantial crowbar current and delay. But in level-shifter 100, switch 115 is momentarily opened (pulsed off) by edge-triggered pulse generator 110 in response to the rising edge in the input signal. The latch state is then more easily changed due to the isolation of the latch from ground. The same isolation from ground occurs in response to a falling edge in the input signal as well. As a result, latch-based level-shifter 100 has improved switching speeds and reduced power consumption as compared to conventional latch-based level-shifter operation. These advantageous features may be better appreciated with regard to the following example instantiation of latch-based level-shifter 100.

Figure 2:
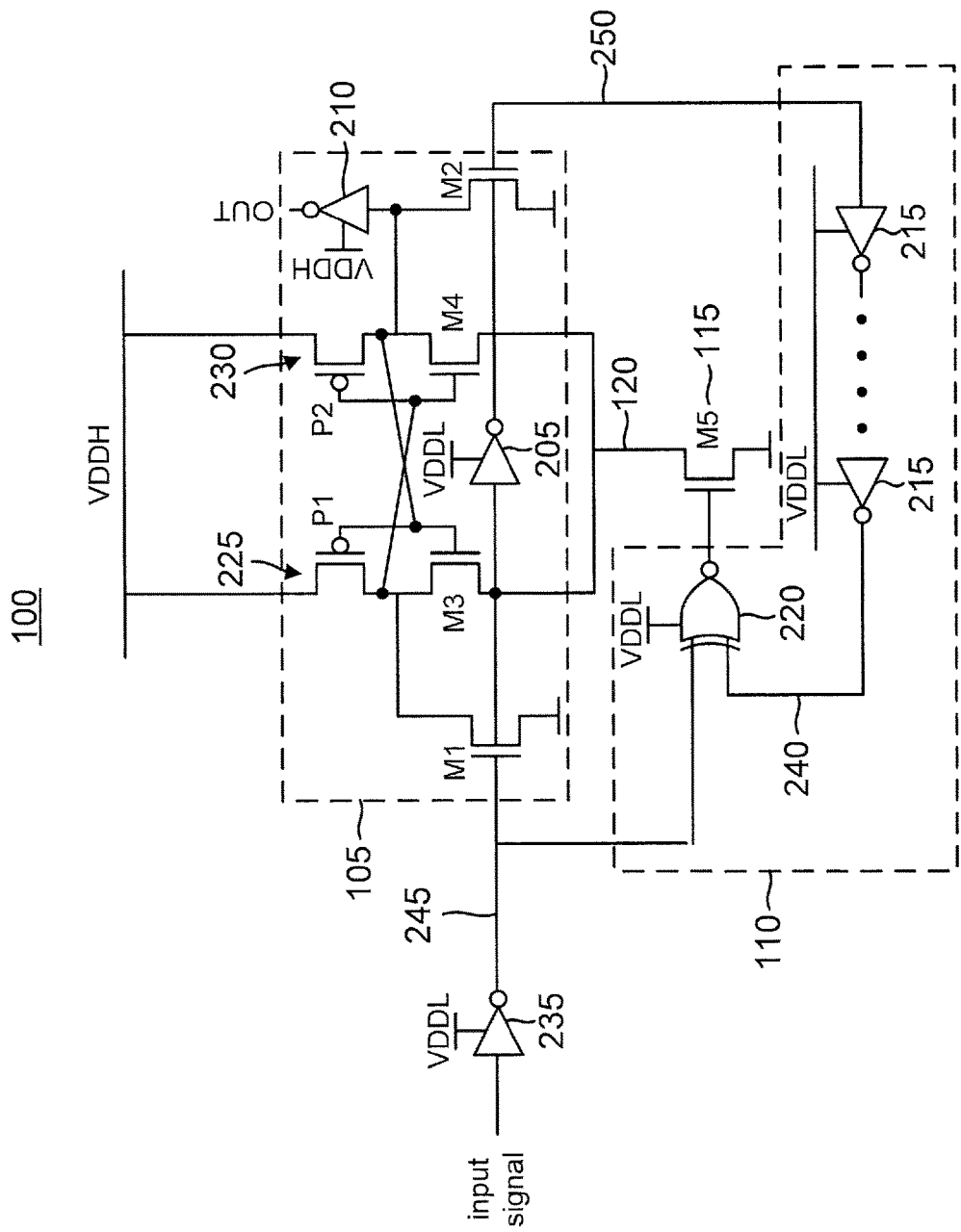
FIG. 2 is a schematic diagram of the latch-based level-shifter of FIG. 1.

A circuit diagram for latch-based level-shifter 100 is shown in FIG. 2. Latch core 105 includes an inverter 225 cross-coupled with an inverter 230. Inverter 225 comprises a PMOS transistor P1 having its source tied to a high-voltage-domain power supply node supplying the high power supply voltage VDDH. Inverter 225 further comprises an NMOS transistor M3 having its source tied to ground node 120 for latch core 105 and its drain coupled to the drain of PMOS transistor P1. Similarly, inverter 230 comprises a PMOS transistor P2 having its source tied to the high-voltage-domain power supply node. Inverter 230 further comprises an NMOS transistor M4 having its source tied to ground node 120 for latch core 105 and its drain coupled to the drain of PMOS transistor P2. The gates of transistors P1 and M3 couple to the drains of transistors P2 and M4. Similarly, the gates of transistors P2 and M4 couple to the drains of transistors P1 and M3.

The low-voltage domain input signal is inverted by a first inverter 235 powered by the low-voltage-domain power supply voltage VDDL to form a first inverter output signal 245 that drives a gate of a first NMOS access transistor M1 that has its drain tied to the drains of transistors P1 and M3 in cross-coupled inverter 225 and its source tied to ground. First inverter 235 also drives a second inverter 205 powered by the low-voltage-domain supply voltage VDDL. A second inverter output signal 250 from inverter 205 drives a gate of a second NMOS access transistor M2 having its source tied to ground and a drain tied to the drains of transistors P2 and M4 in cross-coupled inverter 230. The drains for transistors P2 and M4 also couple to the input of an output inverter 210 that outputs the level-shifted output signal for level-shifter 100. Output inverter 210 is powered by the high-voltage-domain power supply voltage VDDH. In core latch 105, transistors P1, P2, M1, M2, M3, and M4 are all exposed to the high-voltage-domain power supply voltage VDDH. These transistors as well as the transistors (not illustrated) in output inverter 210 should thus all comprise thick-oxide transistors having a gate oxide thickness that is sufficiently robust to the power supply voltage VDDH. In contrast, the remaining transistors in latch-based level-shifter 100 may all comprise thin-oxide transistors having a reduced gate oxide thickness that would not be robust to the power supply voltage VDDH. Access transistor M1 and M2 will thus have a relatively small amount of overdrive at reduced levels for VDDL as discussed previously. Despite this relatively small overdrive, access transistors M1 and M2 need not be increased in size as compared to transistors P1 and P2 as is the case for conventional architectures as will be explained further herein.

Given this structure in core latch 105, consider the case of the input signal being low (ground). Since the input signal is low, first inverter output signal 245 from first inverter 235 is high (VDDL) so that first access transistor M1 is conducting to pull the drains of transistors P1 and M3 (the output node of cross-coupled inverter 225) to ground. In turn, this low state for the drains of transistor P1 and M3 causes transistor P2 in cross-coupled inverter 230 to be conducting. Second access transistor M2 is off when the input signal is low because second inverter output signal 250 from second inverter 205 is also low at that time. The output signal is thus low since output inverter 210 inverts the VDDH voltage output from cross-coupled inverter 230. When the input signal then has a rising edge (transitions to VDDL), second access transistor M2 turns on to pull the output (the drains of transistors P2 and M4) of cross-coupled inverter 230 low. But at the onset of the rising edge for the input signal, transistor P2 is conducting. There could thus be a momentary "tug of war" between second access transistor M2 and cross-coupled inverter transistor P2 until cross-coupled inverter transistor P2 can finally be turned off so that the output signal can go high to VDDH. During this PMOS vs. NMOS transistor struggle in a conventional latch-based level-shifter, both second access transistor M2 and corresponding cross-coupled inverter transistor P2 are conducting an undesirable crowbar current that wastes power. In addition, the PMOS vs. NMOS transistor struggle takes time to complete, which slows the operating speed.

To substantially reduce the wasteful crowbar current and associated delay issues, pulse generator 110 pulses off switch 115 (in this embodiment, switch 115 is implemented as an NMOS switch transistor M5) responsive to the rising edge in the input signal. For example, pulse generator 110 may include an XNOR gate 220 powered by the VDDL supply voltage. XNOR gate 220 XNORs first inverter output signal 245 and a delayed inverted signal 240 formed by delaying and inverting second inverter output signal 250 through a delay chain of inverters 215. Prior to the rising edge of the input signal, second inverter output signal 250 was also low so that delayed inverted signal 240 was charged to VDDL. After the rising edge of the input signal, delayed inverted signal 240 will eventually go low as the rising edge of second inverter output signal 250 is delayed and inverted through inverters 215. However, delayed inverted version 240 of second inverter output signal 250 will initially still be low immediately after the rising edge in the input signal due to the delay through inverters 215. XNOR gate 220 will thus process a grounded signal (first inverter output signal 245) and a binary high signal (delayed inverted signal 240) for a brief transition period following the rising edge of the input signal. The output signal from XNOR gate 220 will then momentarily pulse low in response to the rising edge of the input signal. In turn, this low pulse from XNOR gate 220 will switch off NMOS switch transistor M5 coupled between ground and virtual ground node 120 of core latch 105. NMOS switch transistor M5 will then switch off for the transition period determined by the delay through inverter 205 and inverters 215. At the conclusion of the transition period, the high state for second inverter output signal 250 will have driven through inverters 215 so the delayed inverted signal 240 will go low since there is an odd number of inverters 215. At that point, XNOR gate 220 is receiving two low signals so it will drive its output signal high. As a result, switch transistor MS switches back on at the conclusion of the transition period to recouple cross-coupled inverters 225 and 230 back to ground.

A similar pulsing off of switch transistor M5 for the transition period occurs in response to a falling edge of the input signal. Prior to the falling edge, both first inverter output signal 245 and delayed inverted signal 240 are low (grounded). XNOR gate 220 is thus driving switch transistor M5 on prior to the falling edge of the input signal. Immediately subsequent to the falling edge of the input signal, first inverter output signal 245 will go high to VDDL while delayed inverted signal 240 remains grounded. XNOR gate 220 would then pulse switch transistor M5 off for the duration of the transition period as determined by the delay through inverter 205 and inverters 215. After completion of the transition period, delayed inverted signal 240 will go high to VDDL so that XNOR gate 220 will again drive switch transistor M5 on.

In response to the falling edge of the input signal, transistors P1 and M4 must switch off Conversely, transistors P2 and M3 must switch on. To get transistor P2 to switch on, access transistor M1 must discharge the drain of transistor P1 from VDDH to a voltage that is sufficiently low enough to switch on transistor P2 and switch off transistor M4. The drain voltage for transistor P1 at which transistor P2 becomes stronger (conducting more current) than transistor M4 such that transistor P2 switches on and transistor M4 switches off is the trip point for inverter 230. Such a trip point is conventional in any latch-based level-shifter. But note that switch transistor M5 pulsing off weakens transistor M4 in comparison to transistor P2 because transistor M4 can then no longer discharge current from the drain of transistor P2 to ground during the transition period in which switch transistor M5 is not conducting. As a result, the trip point for inverter 230 occurs at a higher voltage than would be the case in a conventional latch-based level-shifter. The state of core latch 205 is thus flipped at an increased speed and with substantially less discharge of crowbar current as compared to conventional architectures. An analogous increase of the trip point voltage for inverter 225 occurs when switch transistor M5 is pulsed off responsive to a rising edge in the input signal. Access transistor M2 is thus able to more quickly discharge the drain of transistor P2 so as to switch on transistor P1 and turn transistor M3 off because transistor M3 is weakened by the switching off of switch transistor M5.

In one embodiment, edge-triggered delay circuit 110 and switch transistor M5 may be deemed to comprise a means for isolating the pair of cross-coupled inverters (225 and 230) from ground for a transition period responsive to a transition of the low-voltage-domain input signal from ground to a low supply voltage (VDDL) and responsive to a transition of the low-voltage-domain input signal from the low supply voltage to ground and for recoupling the pair of cross-coupled inverters to ground upon termination of each transition period.

In addition to the reduction of power consumption, the increase in switching speeds, its density also increased in that first and second access transistors M1 and M2 need not be sized so as to be relatively large in comparison to cross-coupled inverter transistors P1 and P2. In contrast, conventional latch-based level-shifters required relatively large access transistors so that the state of the latch could be flipped without incurring inordinate delay. A method of operation for level-shifter 100 will now be discussed.

Figure 3:
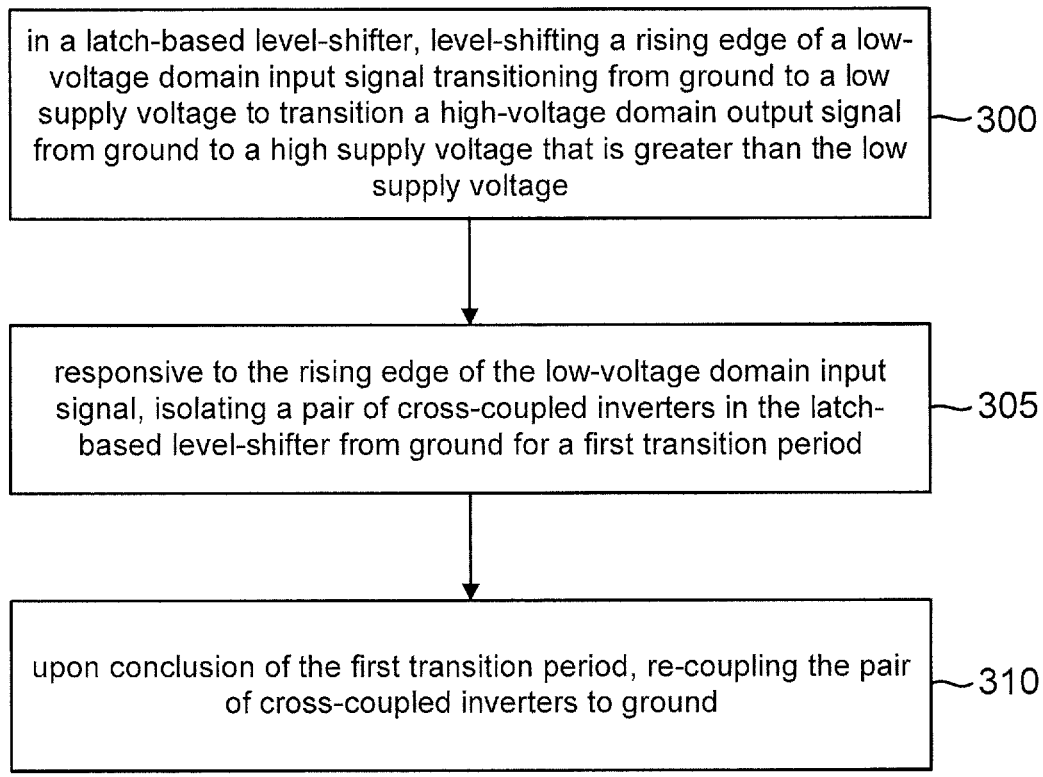
FIG. 3 is a flowchart for an example method of use for a latch-based level-shifter in accordance with an embodiment of the disclosure.

A flowchart for an example method of operation is shown in FIG. 3. The method includes an act 300 performed by a latch-based level-shifter. Act 300 comprises level-shifting a rising edge of a low-voltage-domain input signal transitioning from ground to a low supply voltage to transition a high-voltage-domain output signal from ground to a high supply voltage that is greater than the low supply voltage. The level-shifting by level-shifter 100 of the output signal from ground to VDDH responsive to the input signal transitioning from ground to VDDL is an example of act 300. In addition, the method includes an act 305 that is responsive to the rising edge of the low-voltage domain input signal and which comprises isolating a pair of cross-coupled inverters in the latch-based level-shifter from ground for a transition period. The switching off of switch transistor M5 responsive to the rising edge in the input signal is an example of act 305. Finally, the method includes an act 310 performed upon conclusion of the transition period and which comprises re-coupling the pair of cross-coupled inverters to ground. The switching on of switch transistor M5 after the conclusion of the transition period following a rising edge in the input signal is an example of act 310.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A circuit, comprising:
a latch including a pair of cross-coupled inverters having a virtual ground node, the latch being configured to level-shift a low-voltage-domain input signal from a low voltage domain into a high-voltage-domain output signal for a high voltage domain, wherein the pair of cross-coupled inverters are configured to be powered by a high power supply voltage for the high voltage domain;
a switch coupled between the virtual ground node and ground;
an edge-triggered pulse generator configured to pulse the switch off for a transition period responsive to rising edges in the low-voltage-domain input signal and responsive to falling edges in the low-voltage-domain input signal;
a first NMOS access transistor coupled to an output node of a first one of the cross-coupled inverters; and
a first inverter powered by low power supply voltage domain, the first inverter being configured to invert the low-voltage-domain input signal into a first inverter output signal, and wherein a gate of the first NMOS access transistor is configured to be driven by the first inverter output signal, and wherein the high power supply voltage is greater than the low power supply voltage.

2. The circuit of claim 1, further comprising:
a second NMOS access transistor coupled to an output node of a remaining second one of the cross-coupled inverters.

3. The circuit of claim 2, further comprising:
a second inverter powered by the low power supply voltage for the low power domain, the second inverter being configured to invert the first inverter output signal into a second inverter output signal, and wherein a gate of the second NMOS access transistor is configured to be driven by the second inverter output signal.

4. The circuit of claim 3, further comprising a third inverter having an input node coupled to the output node of the second cross-coupled inverter, and wherein the third inverter is configured to invert a voltage for the output node of the second cross-coupled inverter to produce the high-voltage-domain output signal.

5. The circuit of claim 1, wherein the edge-triggered pulse generator comprises a logic gate and a delay chain of inverters.

6. The circuit of claim 5, wherein the logic gate comprises an XNOR gate.

7. The circuit of claim 6, wherein the delay chain of inverters comprises an odd number of inverters configured to provide a delayed inverted signal to an input of the XNOR gate.

8. The circuit of claim 6, wherein the switch comprises an NMOS switch transistor having a source coupled to ground and a drain coupled to the virtual ground node for the cross-coupled inverters, and wherein the XNOR gate is configured to drive a gate of the NMOS switch transistor.

9. The circuit of claim 1, wherein a first one of the cross-coupled inverters comprises a first PMOS transistor having a source coupled to a high-voltage-domain power supply node and a drain coupled to a first NMOS transistor having a source coupled to the virtual ground node.

10. The circuit of claim 9, wherein a remaining second one of the cross-coupled inverters comprises a second PMOS transistor having a source coupled to the high-voltage-domain power supply node and a drain coupled to a second NMOS transistor having a source coupled to the virtual ground node.

11. A method, comprising:
powering a latch-based level-shifter including a first cross-coupled inverter cross-coupled with a second cross-coupled inverter with a high power supply voltage from a high power domain;
in a first inverter powered by a low power supply voltage for a low power domain, inverting a low-power-domain input signal into an inverted signal, wherein the high power supply voltage is greater than the low power supply voltage;
driving a gate of a first NMOS access transistor with the inverted signal, wherein a drain of the first NMOS access transistor couples to an input of the first cross-coupled inverter and a drain of the first NMOS access transistor couples to ground;
in the latch-based level-shifter, level-shifting a rising edge of the low-power-domain input signal transitioning from ground to the low power supply voltage to transition a high-power-domain output signal from ground to the high power supply voltage;
responsive to the rising edge of the low-voltage domain input signal, isolating the first cross-coupled inverter and the second cross-coupled inverter from ground for a first transition period; and
upon conclusion of the first transition period, re-coupling the pair of cross-coupled inverters to ground.

12. The method of claim 11, further comprising:
in the latch-based level-shifter, level-shifting a falling edge of the low-voltage domain input signal transitioning from the low power supply voltage to ground to transition the high-voltage domain output signal from the high power supply voltage to ground;
responsive to the falling edge of the low-voltage domain input signal, isolating the pair of cross-coupled inverters from ground for a second transition period; and
upon conclusion of the second transition period, re-coupling the pair of cross-coupled inverters to ground.

13. The method of claim 12, wherein a duration of the first transition period equals a duration of the second transition period.

14. The method of claim 11, wherein isolating the pair of cross-coupled inverters comprises switching off a switch transistor coupled between the pair of cross-coupled inverters and ground.

15. The method of claim 14, wherein switching off the switch transistor comprises switching off an NMOS switch transistor.

16. A circuit, comprising:
a latch including a pair of cross-coupled inverters, the latch being configured to level-shift a low-voltage-domain input signal into a high-voltage-domain output signal;
means for isolating the pair of cross-coupled inverters from ground for a transition period responsive to a transition of the low-voltage-domain input signal from ground to a low supply voltage and responsive to a transition of the low-voltage-domain input signal from the low supply voltage to ground and for recoupling the pair of cross-coupled inverters to ground upon termination of each transition period, wherein a first one of the cross-coupled inverters comprises a first PMOS transistor having a source coupled to a high-voltage-domain power supply node configured to supply a high supply voltage that is greater than the low supply voltage, the first PMOS transistor having a drain coupled to a first NMOS transistor having a source coupled to the means for isolating, and wherein a remaining second one of the cross-couped inverters comprises a second PMOS transistor having a source coupled to the high-voltage-domain power supply node and a drain coupled to a second NMOS transistor having a source coupled to means for isolating;
a first NMOS access transistor coupled to an output node of a first one of the cross-coupled inverters, and
a second NMOS access transistor coupled to an output node of a remaining one of the cross-coupled inverters.

\* \* \* \* \*